US010574244B2

(12) United States Patent
Vergauwen et al.

(10) Patent No.: US 10,574,244 B2
(45) Date of Patent: Feb. 25, 2020

(54) CLOSED-LOOP OSCILLATOR BASED SENSOR INTERFACE CIRCUIT

(71) Applicant: Melexis Technologies NV, Tessenderlo (BE)

(72) Inventors: Johan Vergauwen, Kruibeke (BE); Elisa Sacco, Leuven (BE)

(73) Assignee: Melexis Technologies NV, Tessenderlo (BE)

( * ) Notice: Subject to any disclaimer, the term of this patent is extended or adjusted under 35 U.S.C. 154(b) by 0 days.

(21) Appl. No.: 16/048,633

(22) Filed: Jul. 30, 2018

(65) Prior Publication Data
US 2019/0044523 A1    Feb. 7, 2019

(30) Foreign Application Priority Data
Aug. 2, 2017   (EP) ..................................... 17184589

(51) Int. Cl.
*G01D 3/036*   (2006.01)
*G01D 5/16*    (2006.01)
(Continued)

(52) U.S. Cl.
CPC .............. *H03L 7/099* (2013.01); *G01D 3/036* (2013.01); *G01D 5/16* (2013.01); *G01D 21/00* (2013.01);
(Continued)

(58) Field of Classification Search
CPC .......... G01D 3/036; G01D 5/16; G01D 18/00; G01D 21/00; G01R 19/252; H03M 1/06;
(Continued)

(56) References Cited

U.S. PATENT DOCUMENTS

| 3,631,342 A | * | 12/1971 | McDonald | G01R 19/18 324/100 |
| 3,668,690 A | * | 6/1972 | Ormond | H03M 1/60 341/157 |

(Continued)

FOREIGN PATENT DOCUMENTS

EP    0256811 A2    2/1988

OTHER PUBLICATIONS

Danneels et al., "A Novel PLL-based Sensor Interface for Resistive Pressure Sensors," Procedia Engineering, vol. 5, 2010, pp. 62-65.
(Continued)

*Primary Examiner* — Levi Gannon
(74) *Attorney, Agent, or Firm* — Workman Nydegger

(57) ABSTRACT

An oscillator-based sensor interface circuit includes an oscillator and a switching means is arranged for switching between at least two signals to be applied to the oscillator via that input. At least one of the signals is an electrical signal representative of an electrical quantity. A counter is arranged to count a number of cycles produced by the oscillator. A control logic is arranged to control the switching means and to derive a control output signal from a first number of counted oscillator cycles. A feedback element is arranged for converting a representation of the control output signal into a feedback signal used directly or indirectly to maintain a given relation between the first number of counted oscillator cycles.

15 Claims, 4 Drawing Sheets

(51) Int. Cl.
*G01R 19/252* (2006.01)
*H03L 7/099* (2006.01)
*G01D 21/00* (2006.01)
*H03M 3/00* (2006.01)

(52) U.S. Cl.
CPC .......... *G01R 19/252* (2013.01); *H03M 3/422* (2013.01); *H03M 3/458* (2013.01)

(58) Field of Classification Search
CPC .... H03M 1/0604; H03M 1/10; H03M 1/1014; H03M 1/60; H03M 3/422; H03M 3/458
USPC .......................................................... 331/65
See application file for complete search history.

(56) References Cited

U.S. PATENT DOCUMENTS

| | | | | |
|---|---|---|---|---|
| 3,965,744 | A | | 6/1976 | Gutjahr |
| 4,011,500 | A * | 3/1977 | Pelletier | ............... G01R 19/252 324/725 |
| 4,357,599 | A * | 11/1982 | Takahashi | ........... H03M 1/0612 341/157 |
| 5,092,330 | A * | 3/1992 | Duggan | ................. A61N 1/368 341/157 |
| 5,425,073 | A * | 6/1995 | Bitzer | .................. G01D 5/2216 331/65 |
| 5,483,172 | A * | 1/1996 | Radford | ............... G01N 27/221 324/685 |
| 7,015,762 | B1 * | 3/2006 | Nicholls | ................... H03L 1/00 331/10 |
| 9,379,731 | B1 * | 6/2016 | Roham | ................... H03M 1/60 |
| 2011/0193731 | A1 * | 8/2011 | Daniels | ............... H03M 1/1042 341/118 |
| 2013/0271308 | A1 * | 10/2013 | Osaki | .................. H03M 1/1014 341/164 |

OTHER PUBLICATIONS

Prabha et al., "A VCO-based Current-to-Digital Converter for Sensor Applications," Proceedings of the IEEE 2014 Custom Integrated Circuits Conference, Sep. 15-17, 2014, 4 Pages.
Prabha et al., "A Highly Digital VCO-Based ADC Architecture for Current Sensing Applications," IEEE Journal of Solid-State Circuits, vol. 50, No. 8, Aug. 2015, pp. 1785-1795.
Extended European Search Report from EP Application No. EP 17184589.4, dated Jan. 26, 2018.

* cited by examiner

CLOSED-LOOP OSCILLATOR BASED SENSOR INTERFACE CIRCUIT

FIELD OF THE INVENTION

The present invention is generally related to the field of sensor interface circuits for sensor systems.

BACKGROUND OF THE INVENTION

Sensors are increasingly important in any field where finer and ever more intelligent control is needed. Examples are found in the growing fields of automotive applications or wireless sensor networks (WSN). In the automotive industry sensors are essential for applications ranging from increased safety to road stability as well as to improve car performance and reliability demanded by customers. Further, compact and low-power sensor interfaces are needed to be competitive on the growing market and to enable new applications for 'the Internet of things'.

Although the market asks for additional functionality, the price pressure remains. The silicon area is a main contributor to the cost of the sensor interface, therefore the interface has to be made as small as possible. This should not only be valid for the technology nodes that are used today (and which are still relative big for the automotive industry), but also in more advanced technologies.

To realize small-area and low-power constraints, new sensor interface architectures are being investigated. Whereas traditional structures contain large and power-hungry analog building blocks, recently the focus has shifted to frequency conversion instead of voltage conversion. Both approaches are briefly introduced now.

The sensor signal is continuous in time and amplitude. Conventionally this analog signal is amplified, sampled and converted to the digital domain by an analog to digital converter (ADC). A well-known ADC type is a delta-sigma ADC, which exploits an oversampling of the input signal and a noise shaping technique to obtain an improved precision. In most applications, the sensor signal frequency varies from DC up to 10-100 kHz, which allows for the oversampling needed for a Delta-Sigma converter.

Time/frequency-based conversion mechanisms quantize the continuous input signal by using a known time/frequency signal as a reference instead of a voltage. Typically, a time/frequency-based conversion circuit contains two building blocks: a Voltage-to-Time Converter (VTC) transforms the analog signal c(t) into time or frequency information f(t), while a Time-to-Digital Converter (TDC) digitizes this information with the help of a reference frequency. In order to achieve a desired resolution, an accurate reference clock signal is needed. This time/frequency conversion technique is gaining popularity due to its compatibility with newer CMOS technologies. The resolution now depends on the clock frequency instead of the accuracy of analog voltage values. The reduced gate capacitances result in smaller gate delays, improving the timing resolution in these scaled technologies. Furthermore, when the information is stored as frequency information, it is less prone to noise as opposed to when it is stored as voltage information. Sensor signals are in most applications characterized by their low frequency and therefore ideal to use this way of digitization.

Closed-loop oscillator-based sensor interfaces as in FIG. 1 combine the advantages of time based converters (small and scaling with technology) and sigma-delta ADCs (high accuracy due to oversampling and noise shaping). This architecture is basically a Phase-Locked Loop (PLL) structure, but it has also similarities with a sigma-delta converter as explained in the paper "*A novel PLL-based sensor interface for resistive pressure sensors*" (H. Danneels et al., Procedia Engineering, Eurosensors 2010, vol. 5, 2010, pp. 62-65). It has the same noise-shaping properties which contribute in increasing the accuracy (expressed e.g. in terms of SNR).

A typical set-up of a closed-loop oscillator-based sensor read-out circuit contains two controlled oscillators, for example two voltage controlled oscillators (VCOs) which are matched, a binary phase detector to compare the phase difference between the two oscillator outputs and a feedback mechanism towards the sensing means. Optionally a digital filter is provided. The digital output signal of the interface circuit is also derived from the phase detector output.

A conventional oscillator based sensor interface circuit used in a closed loop as illustrated in FIG. 1 operates as follows. A physical quantity is converted by the sensor (1) into electrical signals (11, 12) that influence the oscillators (21, 22) connected to it. The phase of the oscillator outputs (41, 42) is compared in the phase detector (3). The phase detector output signal (31) is fed back through a feedback element (4) to the sensor (1) in order to keep the phase difference between both oscillators small and on average close to zero. The closed-loop ensures that the averaged phase detector output (31) is a digital representation of the physical quantity. The input signal containing the physical quantity (100) to be converted in the sensor typically represents a pressure, temperature or magnetic field. Also other types of physical signals can be used as input to the interface.

In any application scheme there is always some mismatch between two or more functional blocks of the sensor system, even if they have exactly the same schematic and layout. This especially holds for Voltage Controlled Oscillators (or other controlled oscillators, like Current Controlled Oscillators or Sensor Controlled Oscillators). The main drawback of such systems comes from a mismatch between the two VCOs. This mismatch also varies over time and over temperature. As they continuously toggle, two VCOs oscillating at similar frequencies can interfere with each other, leading to artefacts in the digital output.

In many sensor interfaces there are multiple sensors to be converted to the digital domain. E.g. a pressure sensor is often combined with a temperature sensor to be able to compensate the temperature drift of the pressure sensor. In a conventional system with two VCOs it is difficult to multiplex the VCOs between the pressure sensor and the temperature sensor readout.

In the prior art systems using only one oscillator have been proposed, mostly in open-loop systems. However, in the papers "*A VCO-based Current-to-Digital Converter for Sensor Applications*" (Praveen Prabha et al., IEEE Proc. Custom Integrated Circuits Conference (CICC), September 2014) and "*A Highly Digital VCO-Based ADC Architecture for Current Sensing Applications*" (Praveen Prabha et al., IEEE Journal Solid-State Circuits, Vol. 50, No. 8, August 2015, pp. 1785-1795) a closed-loop scheme is proposed wherein the non-linearity in voltage to frequency conversion of the VCO is tackled by placing the VCO in a loop consisting of a simple digital IIR filter and a passive integrator. The IIR filter provides large gain within the signal bandwidth and suppresses the VCO input swing.

In the scheme of Prabha the controlled oscillator always gets the same input. An important drawback of these schemes is that they are sensitive to oscillator drift.

Consequently, there is a need for a closed-loop oscillator-based sensor interface wherein at least one or more of these limitations are avoided or overcome.

SUMMARY OF THE INVENTION

It is an object of embodiments of the present invention to provide for a closed-loop oscillator based sensor interface circuit containing a single oscillator so that problems related to oscillator drift are avoided.

The above objective is accomplished by the solution according to the present invention.

In a first aspect the invention relates to an oscillator-based sensor interface circuit comprising
- an oscillator having an input and arranged for oscillating at a frequency determined by a signal applied to said input,
- switching means arranged for switching between at least two signals to be applied to the oscillator via the input, at least one of said signals being an electrical signal representative of an electrical quantity, said electrical quantity being a converted physical quantity,
- a counter arranged to count a number of cycles produced by the oscillator when receiving via an oscillator output a signal derived from a first signal of the at least two signals applied to the oscillator,
- control logic arranged to control the switching means and to derive a control output signal from a first number of counted oscillator cycles when the first signal is applied to the oscillator and a further number of counted oscillator cycles when another signal of the at least two signals different from the first signal is applied to the oscillator output,
- a feedback element arranged for converting a representation of the control output signal into a feedback signal used directly or indirectly to maintain a given relation between the first number of counted oscillator cycles when the first signal is applied and the further number of counted oscillator cycles when the other signal different from the first signal is applied.

The proposed solution indeed allows for avoiding any effect of oscillator drift. All inputs applied to the switching means make use of the same, sole oscillator. Hence, any drift of the oscillator has a same impact: the sensor signal(s) and, if present, the analog reference signal are affected in the same way.

In a preferred embodiment the first signal is a reference signal and the other signal is the electrical signal representative of the electrical quantity.

In another preferred embodiment the first signal and the other signal form a differential signal.

In an embodiment the switching means is also arranged for applying a third signal, said third signal being a further electrical signal representative of a further electrical quantity, said further electrical quantity being a converted further physical quantity.

In one embodiment the switching means is also arranged for a further reference signal.

In one embodiment the control logic comprises storage means for storing that first number of counted oscillator cycles when the first signal is applied to the oscillator.

In an embodiment the control logic is arranged for resetting said counter at the start of each sampling period, said sampling period consisting of a number of clock cycles.

In another embodiment the oscillator-based sensor interface circuit comprises a synchronization circuit arranged for starting the counting of the counter in a synchronized way with the oscillator when the switching means switches between signals.

Advantageously, the oscillator-based sensor interface circuit further comprises a digital filter arranged for filtering the control output signal and for applying the filtered control output signal to the feedback element.

In another embodiment the counter is arranged to count a number of half cycles instead of cycles.

In an embodiment the oscillator of the sensor interface circuit comprises multiple stages, the output of the different stages being applied to the counter.

In one embodiment the oscillator-based sensor interface circuit comprises a sensing means arranged for converting said physical quantity into the electrical quantity and for outputting to said switching means said electrical signal representative of the electrical quantity.

In a specific embodiment the sensing means contains a variable resistor.

In an embodiment the physical quantity is a pressure, a temperature, a force, an optical signal or a magnetic signal.

In a further embodiment the representation of the control output signal is fed-back to the said control logic in order to generate a second or higher order sigma-delta converter.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
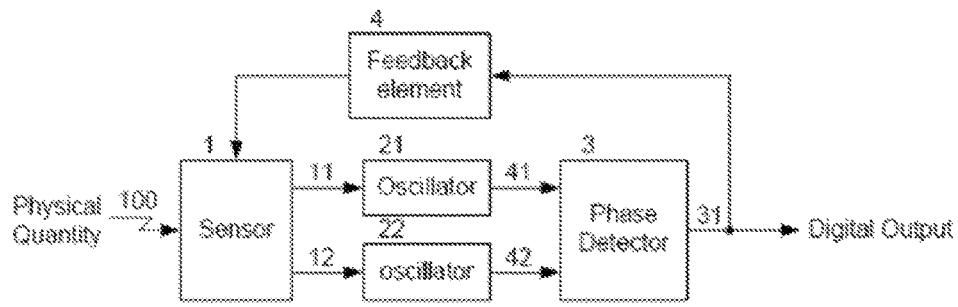
FIG. 1 illustrates a sensor interface circuit with two oscillators as known in the art.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

A sensor converts a physical quantity into an analog electrical quantity. Typically the sensor output signal is too small to be used directly. Therefore a sensor interface circuit amplifies the signal comprising the electrical quantity received from the sensor to obtain a more useful signal. The signal is often also further processed (e.g. filtered) in the sensor interface. Additionally the signal can be converted to a digital signal and further processed in the digital domain. In the context of the present invention a sensor interface circuit is considered to be a structure to transfer the electrical quantity coming out of the sensor into a digital signal. Although the input signal containing the physical quantity (100) to be converted in the sensor often represents a pressure, temperature or magnetic field, also other types of physical signals can be used as input to the interface circuit of this invention.

Although it may be advantageous in many embodiments of the sensor interface circuit of the invention to have the sensor as a part of the interface circuit, this is not strictly required. In other embodiments the sensor(s) may be external to the circuit of the invention and the circuit is fed with an electrical signal representative of the electrical quantity into which the physical quantity is converted in the sensor.

Figure 2:
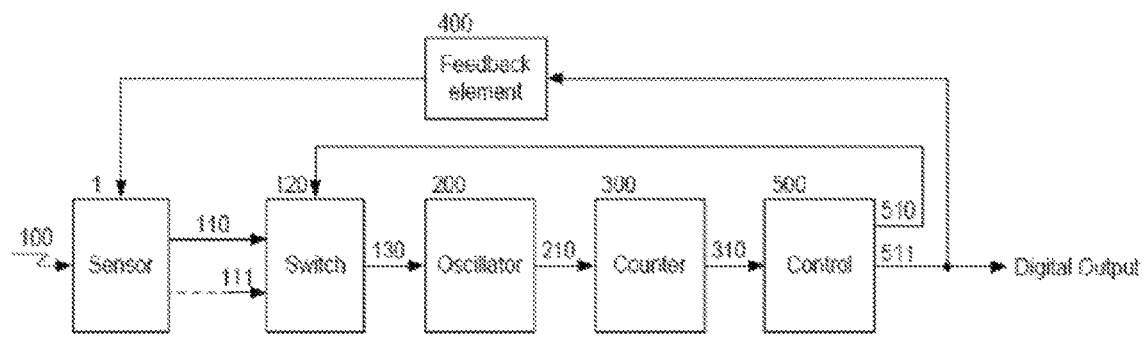
FIG. 2 illustrates an embodiment of a sensor interface circuit according to the invention.

FIG. 2 represents an embodiment of a block scheme of a time-based sensor interface circuit according to the present invention. It comprises a single oscillator (200) and a feedback loop. In a specific embodiment the oscillator is a voltage controlled oscillator (VCO). Since it is highly digital-oriented, the proposed architecture is highly scalable with technology and thus more area-efficient, energy-efficient and robust against process variations and external factors. This makes the structure a good candidate for sensor readout circuitry in emerging applications such as smart sensors, wireless sensor networks, health care monitoring, etc.

The two VCOs of the prior art solutions as in FIG. 1 are substituted by a switch (120) and one VCO (200), while the phase-detector is replaced by a counter (300) and a small digital controller (500). The system still shows first-order noise-shaping due to the integration of the frequency error. By using only one VCO, the proposed architecture overcomes the above-mentioned drawbacks of VCO mismatch and coupling between the two VCO outputs. More detailed explanation is provided later in this description. Furthermore, the proposed architecture can achieve a better energy-efficiency as the number of oscillators, which are the main contributors to the power consumption, is halved. The proposed architecture is therefore a good candidate for sensor interfaces where compactness and energy-efficiency are crucial.

In the interface architecture according to the invention, as depicted in FIG. 2, the conversion uses a single oscillator (200), e.g. a VCO, of which the input can be switched or multiplexed between two or more sources. At least one of the sources is integrated in a feedback control loop. If the sensor generates a differential signal, the multiplexer can switch between both signals forming the differential signal. If the sensor generates a single-ended signal, the multiplexer can switch between the sensor signal and a reference signal (for this reason the signal (111) is indicated by a dashed line). The multiplexer (120) can also switch between different sensor signals (or other signals to be monitored) if multiple sensors or other channels have to be converted to the digital domain. Exemplary embodiments are discussed below.

Figure 3:
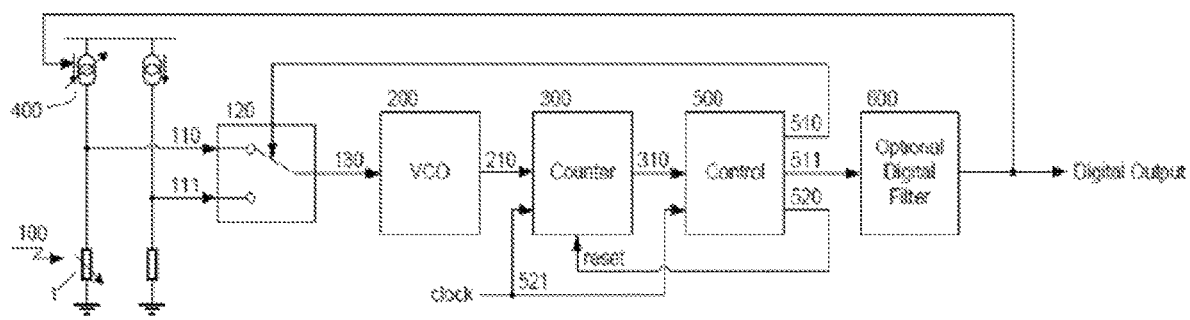
FIG. 3 illustrates a single-ended embodiment of a single-VCO interface circuit according to the invention.
Figure 4:
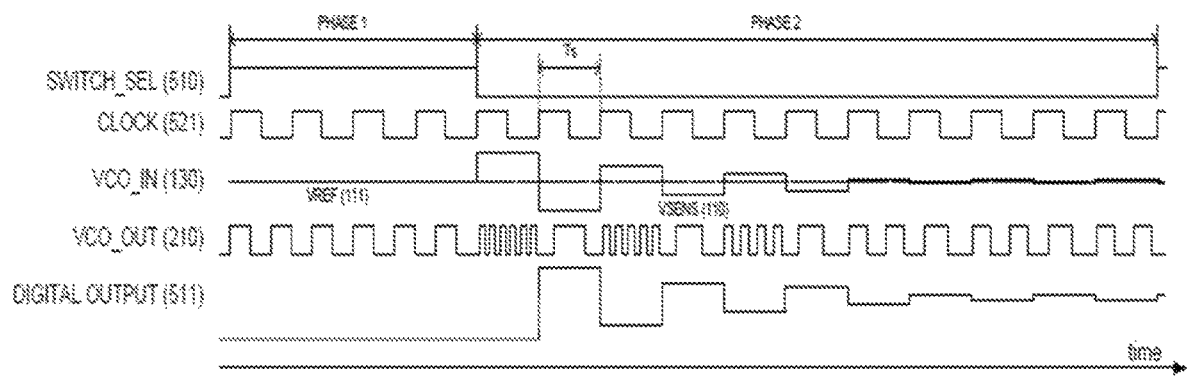
FIG. 4 illustrates some signals from the scheme of FIG. 3 as a function of time.

A single-ended embodiment of the interface circuit of the invention is now described more in detail. An example of a single-ended sensor is a thermistor for which the resistance has to be converted to a temperature signal. The circuit depicted in FIG. 3 is considered. The corresponding signals are shown in FIG. 4.

In this single-ended implementation a reference voltage VREF (111) and the sensor voltage VSENS (110) are the input voltages of the switch (120) in front of the voltage controlled oscillator (110). The reference voltage is created in this example by a fixed current flowing through a fixed resistor. The sensor comprises a variable resistor. The current source on top of the sensor resistor is adjusted to get the resulting sensor voltage VSENS equal to the reference voltage VREF.

The switching between the reference voltage and the sensor voltage is controlled by the digital controller (500). FIG. 4 shows the control signal SWITCH_SEL (510), which divides the timing diagram in two phases, i.e. phase 1 and phase 2. During phase 1 the signal VREF (111) is connected to the VCO input voltage VCO_IN (130) through the switch (120). This results in the VCO to oscillate at a corresponding reference frequency, as shown by the signal VCO OUT (210). During phase 2 the signal VSENS (110) is connected to VCO_IN (130). This results in another VCO frequency. The input VSENS is during phase 2 adjusted by the feedback to have the same VCO frequency in both phases. This also means that the average VCO input voltage (130) will be the same in both phases so that VSENS=VREF.

At each sampling period Ts, the VCO frequency is quantized by the counter (300) counting the periods in the VCO output signal. The counter is reset at the start of each sampling period by the digital controller (500) (using a reset signal (520)), while the VCO (200) is not reset. So, a new period of the VCO that is already ongoing at the moment of sampling is further continued (although the VCO might run the remaining part of the period faster or slower than before). This means that the quantization error is taken into account during the next sampling period, which allows for noise-shaping of the quantization error. Remark that the reset can be replaced by calculating the difference between the new counter value and the previously sampled counter value.

During phase 1 one or more sampling periods Ts are used to calculate the average VCO frequency corresponding to the reference signal VREF (111). Instead one can also count the total number of VCO periods during phase 1 and divide this by the total number of sampling periods. The reference voltage is not changing or only very slowly, so one could also filter the reference frequency further by taking the previous phase 1 results into account.

In phase 2 the sensor voltage VSENS (110) is provided at the input of the VCO (200) and, as in phase 1, the resulting VCO frequency is quantized by the counter. At each sampling period the counted number of VCO periods is compared to the averaged reference count, providing a count difference. This count difference can be further summed up during each sampling period of phase 2. The count difference or its sum or a derived signal (e.g. only the sign of the count difference sum) is used as input of an optional digital filter (600) to obtain the digital output signal. The digital output is also fed back through the feedback element (400) to the sensor (100). The digital output (and so also the feedback signal) is computed every sampling period.

In FIG. 4 the initial VSENS (110) voltage is much higher than the reference voltage VREF (111), which causes the VCO to oscillate much faster during the first sampling period of phase 2 than in phase 1. The resulting control output (511) is after optional filtering fed back to the sensor to decrease the sensor voltage VSENS. During the second sampling period the oscillator is now oscillating too slow. A new digital output is calculated that will increase the oscillating frequency again. This is repeated until the average oscillator period in phase 2 matches the oscillator reference period of phase 1. The average digital output needed to have the same VCO period in both phases is the digital representation of the sensor signal.

The initial voltage and frequency in phase 2 of FIG. 4 is much different from the reference voltage or frequency in phase 1. This can be the case at start-up when the feedback starts at an initial value. The next phase 2 can be started with a much better estimation for the feedback, namely the digital output found at the end of the previous phase 2.

In FIG. 4 the phases are completely defined by the state of SWITCH_SEL (510), so that phase 2 starts immediately after phase 1. However, the VCO can be somewhere in the middle of a period when a new phase starts. This means that some information of the previous phase is used in the next phase, which is typically not wanted. Instead it is possible to start phase 2 (and the corresponding start of the sampling period) a bit later than the end of phase 1. One can start phase 2 at the start of a new VCO period. This can be done by means of a synchronization circuit. Similarly one can start phase 1 at the start of a new VCO period after phase 2 has ended.

The number of sampling periods during each phase is not hard defined. In principle one can just use one sampling period for each phase, but then no noise shaping will happen. Increasing the number of sampling periods has a similar effect as increasing the oversampling ratio of a sigma-delta ADC. Remark that there is no need to have the same amount of sampling periods in both phases. In a preferred embodiment phase 2 is longer than phase 1, to take more samples of the varying sensor signal, while a stable reference allows calculating the reference frequency based on multiple phase 1 periods.

In a preferred embodiment the counter counts the number of oscillator periods. In another embodiment the counter can count both the rising and falling edges of the oscillator, so the number of half periods. If the counter comprises multiple stages, the counter can also count the number of rising and/or falling edges of all stages together. This influences the quantization error.

Figure 5:
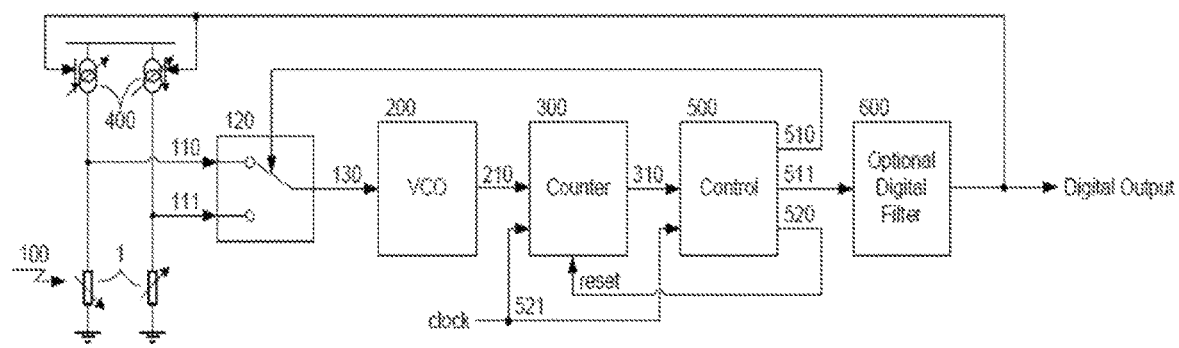
FIG. 5 illustrates a differential embodiment of a single-VCO interface circuit according to the invention.

A differential embodiment of the interface circuit of the invention is now described more in detail based on FIG. 5. The working principle is very similar to a single-ended implementation. Instead of a reference signal, now two sensor signals (110 and 111) from the same sensor are used. The oscillator frequency or period is measured again in both phases. When one sensor voltage is applied to the VCO, the other sensor frequency caused by the other sensor voltage is used instead of a reference frequency. The counter difference is calculated each sampling period and optionally summed together or filtered to derive the digital output, which is also fed back to the sensor.

The feedback signal can go to one or both sensor nodes. In a preferred embodiment the feedback goes to both sensor nodes but not simultaneously: the feedback signal only goes to the sensor node which is at that moment connected to the oscillator. So, if the sensor signal 110 is connected to the VCO, only the current source connected to signal 110 is changed by the feedback, while the current source connected to the sensor signal 111 is varied when signal 111 is connected to the VCO. In another embodiment the feedback is done to both sensor nodes simultaneously.

The number of sampling periods during each phase is also not hard defined in the differential case. In contrast to the single-ended case it is preferred to have the number of sampling periods the same in both phases for the differential case. In some cases it makes sense to have only one long sampling period for each phase. In these cases the feedback occurs only at the end of a phase or optionally even at the end of both phases together.

It is also possible to use a reference signal in combination with a differential sensor signal. In that case an additional phase is used for the reference signal. Both sensor nodes are now regulated towards the reference signal. This offers the advantage that also the common mode voltage of the sensor is regulated automatically.

Figure 6:
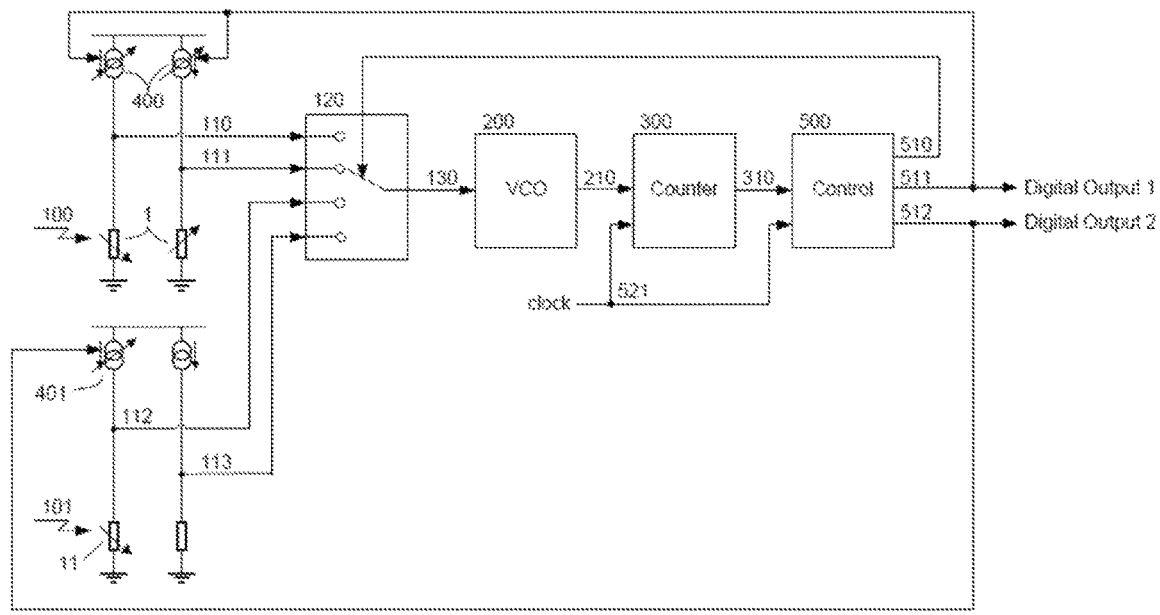
FIG. 6 illustrates an embodiment of a single-VCO interface circuit comprising a plurality of sensors.

In another preferred embodiment a single oscillator is used to convert multiple sensors to the digital domain, as shown in FIG. 6. The working principle remains exactly the same. However, now there are multiple digital outputs: each sensor has its own digital output and this digital output is only fed back to the sensor where it belongs to. The reference signal can be shared between multiple sensors.

Figure 7:
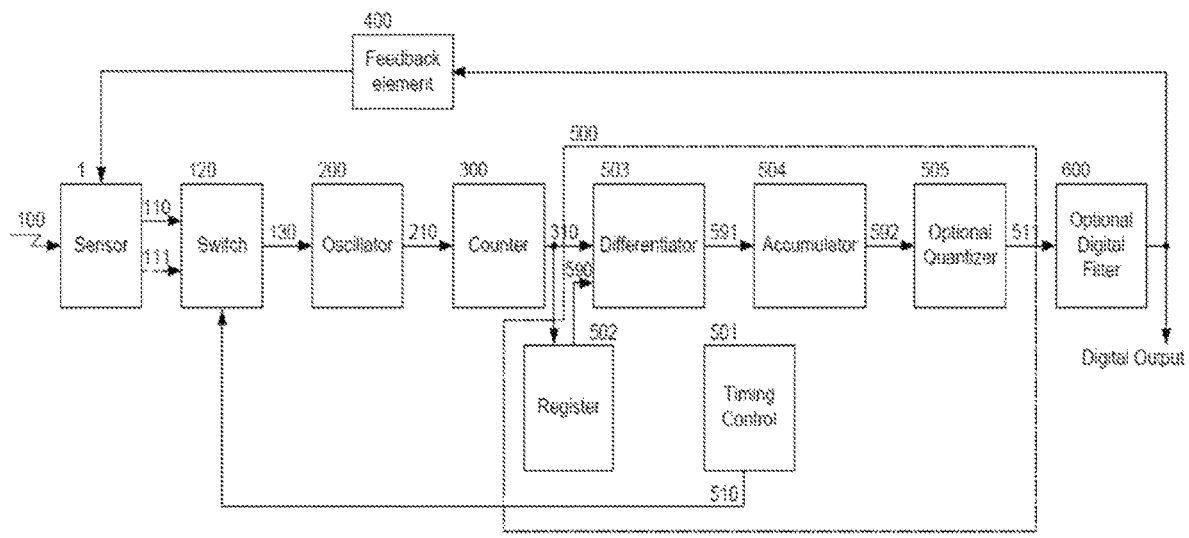
FIG. 7 illustrates an embodiment of a single-VCO interface circuit as a first order system.

FIG. 7 gives a more detailed representation of FIG. 2, wherein the control block (500) is split in different sub-blocks. In this example the control block comprises a timing control block (501), a register (502), a differentiator (503), an accumulator (504) and an optional quantizer (505). The timing control block (501) controls the switching means (via control line 510) and is also responsible for the correct timing signals of the other blocks in the control block. These other timing signals are not drawn in order to not overload the figure. The register (502) is used to store the counter output (310) when needed, e.g. in the single-ended case it stores the counter value of the reference. The differentiator makes the difference between the stored counter value (590) and the new counter value (310). This difference (591) of each sampling period is summed in the accumulator (504). Remark that the accumulator is cleared at the start of a new phase, so at the moment that the switching means switches to another input. The accumulator output (592) is optionally further quantized. The output of the quantizer (505) or of the accumulator (504) in front of it is the same as the output of the control block (500) in FIG. 2. In many implementations the control output (511) is further filtered before it is used as digital output and as feedback signal.

Figure 8:
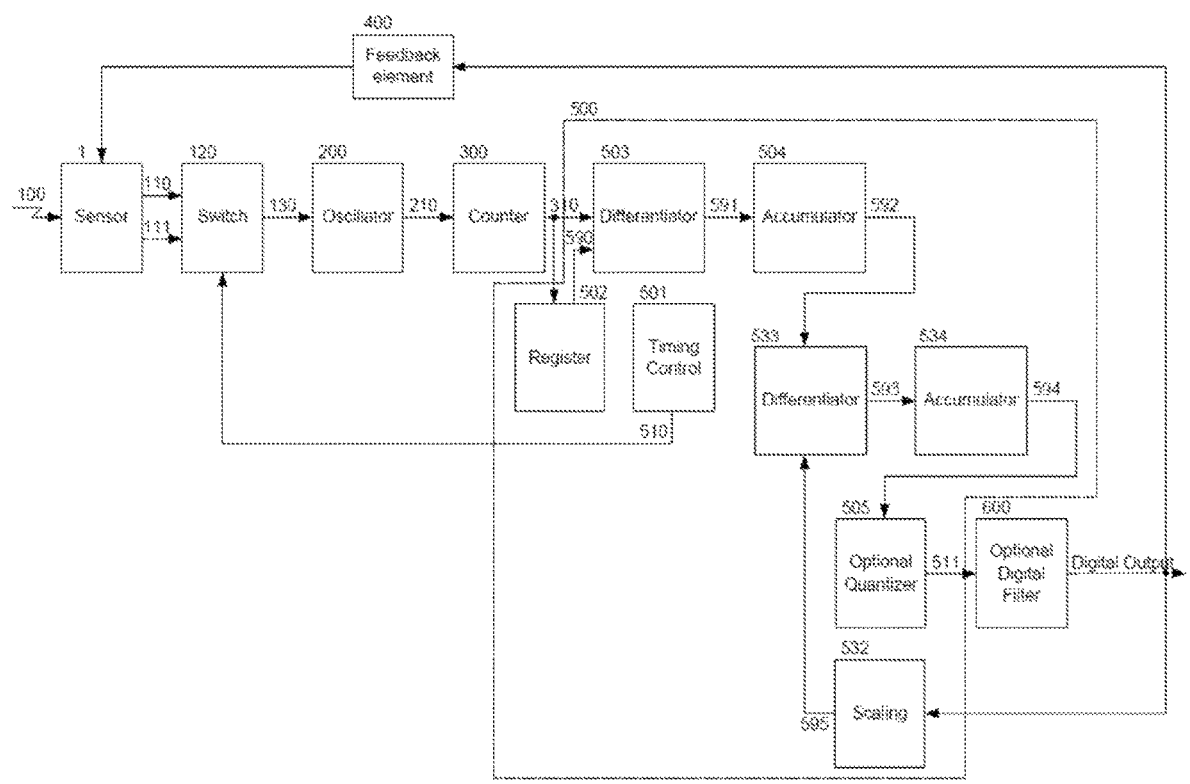
FIG. 8 illustrates a second order sigma-delta implementation of the proposed closed-loop single-oscillator sensor interface.

The embodiment of FIG. 7 represents a first order sigma-delta converter, but it is also possible to use a higher order converter in the invention. FIG. 8 shows a second order sigma-delta implementation of the proposed closed-loop single-oscillator sensor interface. Compared to FIG. 7 an additional differentiator (533), an additional accumulator (534) and a scaling block (532) is added. The digital output is now not only fed-back to the sensor through the feedback element (400), but it is also fed-back in the control block. The digital output is scaled in scaling block (532) and afterwards subtracted in the second differentiator (533) from the output (592) of the first accumulator. The differentiator output (593) is further integrated in accumulator (534). The output (594) of the second accumulator can be further quantized (505) and/or filtered (600) to generate the digital output.

The working principle described above is not only applicable to the described scheme, but it can be applied and implemented in a broader context. Both closed-loop and open loop schemes can benefit of this approach. Further it is not only applicable to sensor interfaces, but also to stand-alone ADCs.

Some important advantages of the present invention, in particular over the prior art schemes of Praveen Prabha (see the background section), are summarized here. As opposed to Prabha, the invention in the invention is switched between two or more sources. The feedback signal is based on the counter output created when one signal is connected to the control input of the oscillator and on the counter output created when another signal is connected to the controlled oscillator input.

If the sensor is generating only a single-ended output, then in one phase this sensor signal is connected to the oscillator, while in another phase an analog reference signal is used as input for the oscillator. The analog reference is using the same oscillator, so any drift of the oscillator has the same impact on the sensor signal as on the reference signal. Therefore, the scheme according to the invention is robust against oscillator drifts. This is not the case in the Prabha proposal.

The proposed sensor interface circuit also allows switching the control input of the oscillator between multiple sensors. So the need to have multiple oscillators is avoided. This reduces the area and the current consumption. Prabha does not foresee this option. His system has to be duplicated in that case for every sensor. Adding extra oscillators increases the risk that an oscillator is disturbing other oscillators.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An oscillator-based sensor interface circuit comprising:
   an oscillator having an input and arranged for oscillating at a frequency determined by a signal applied to said input,
   a switch configured to switch between at least two signals to be applied to said oscillator via said input, at least one of said signals being an electrical signal representative of an electrical quantity, said electrical quantity being a converted physical quantity,
   a counter arranged to count a number of cycles produced by said oscillator when receiving from an output of said oscillator a signal derived from a first signal of said at least two signals applied to said oscillator, control logic arranged to control said switch and to derive a control output signal from a first number of counted oscillator cycles when said first signal is applied to said oscillator and a further number of counted oscillator cycles when another signal of said at least two signals different from said first signal is applied to said oscillator, a feedback element arranged for converting a representation of said control output signal into a feedback signal used directly or indirectly to adjust at least one of said at least two signals in order to maintain a given relation between said first number of counted oscillator cycles when said first signal is applied to said oscillator and said further number of counted oscillator cycles when said other signal different from said first signal is applied to said oscillator.

2. The oscillator-based sensor interface circuit as in claim 1, wherein said first signal is a reference signal and said other signal is said electrical signal representative of said electrical quantity.

3. The oscillator-based sensor interface circuit as in claim 1, wherein said first signal and said other signal form a differential signal.

4. The oscillator-based sensor interface circuit as in claim 1, wherein said switch is also arranged for applying a third signal, said third signal being a further electrical signal representative of a further electrical quantity, said further electrical quantity being a converted further physical quantity.

5. The oscillator-based sensor interface circuit as in claim 1, wherein said switch is also arranged for applying a further reference signal.

6. The oscillator-based sensor interface circuit as in claim 1, wherein said control logic comprises a storage configured to store said first number of counted oscillator cycles when said first signal is applied to said oscillator.

7. The oscillator-based sensor interface circuit as in claim 1, wherein said control logic is arranged for resetting said counter at the start of each sampling period.

8. The oscillator-based sensor interface circuit as in claim 1, comprising a synchronization circuit arranged for starting the counting of said counter in a synchronized way with said oscillator when said switch switches between signals.

9. The oscillator-based sensor interface circuit as in claim 1, further comprising a digital filter arranged for filtering said control output signal and for applying said filtered control output signal to said feedback element.

10. The oscillator-based sensor interface circuit as in claim 1, wherein said counter is arranged to count a number of half cycles instead of cycles.

11. The oscillator-based sensor interface circuit as in claim 1, wherein said oscillator comprises multiple stages, the output of the different stages being applied to said counter.

12. The oscillator-based sensor interface circuit as in claim 1, comprising a sensor configured to convert said physical quantity into said electrical quantity and for outputting to said switch said electrical signal representative of said electrical quantity.

13. The oscillator-based sensor interface circuit as in claim 12, wherein said sensor contains a variable resistor.

14. The oscillator-based sensor interface circuit as in claim 12, wherein said physical quantity is a pressure, a temperature, a force, an optical signal or a magnetic signal.

15. The oscillator-based sensor interface circuit as in claim 1, wherein said representation of said control output signal is fed-back to the said control logic in order to generate a second or higher order sigma-delta converter.

* * * * *